United States Patent [19]

Maschek et al.

[11] Patent Number: 4,584,558
[45] Date of Patent: Apr. 22, 1986

[54] ANALOG/DIGITAL CONVERTER

[75] Inventors: Martin Maschek, Würenlos; Georg Mastner, Niederrohrdorf, both of Switzerland

[73] Assignee: BBC Brown, Boveri & Co., Ltd., Baden, Switzerland

[21] Appl. No.: 733,877

[22] Filed: May 14, 1985

[30] Foreign Application Priority Data

May 15, 1984 [CH] Switzerland .................. 2379/84

[51] Int. Cl.⁴ .............................................. H04B 14/06
[52] U.S. Cl. ............................. 340/347 AD; 324/115; 375/27
[58] Field of Search ................ 340/347 AD; 324/115, 324/116; 375/27, 28, 29, 30, 31, 32, 33

[56] References Cited

U.S. PATENT DOCUMENTS

| | | | |
|---|---|---|---|
| 3,646,586 | 2/1972 | Kurz | 340/347 AD |
| 3,825,832 | 7/1974 | Frei | 375/28 |
| 3,981,005 | 9/1976 | Takayama | 340/347 AD |
| 4,540,974 | 9/1985 | Schanne | 340/347 AD |

Primary Examiner—Charles D. Miller
Attorney, Agent, or Firm—Oblon, Fisher, Spivak, McClelland & Maier

[57] ABSTRACT

An analog/digital converter wherein an analog input signal is applied to a variable gain input amplifier which has an output connected to a subtractor. Also connected to the subtractor is the output of a D/A converter, the input of which is connected to the output of an integrator. The subtractor forms from the output signal of the input amplifier and that of the D/A converter a difference signal which is used by a tracking circuit for generating tracking signals for the integrator. For the purpose of widening the dynamic range, the input amplifier contains four scaling amplifiers, one of which is connected by a selection switch to the output of the input amplifier. The scaling factors of the second, third, and fourth scaling amplifiers are $\frac{1}{4}$, 1/16, and 1/64, respectively, of that of the first scaling amplifier. If the output of the integrator exceeds predetermined limits, a control logic circuit sets the selection switch to the scaling amplifier having the next-smaller scaling factor, effects a resetting of the output signal of the integrator which corresponds to a division by four of this signal when it exceeds one of the limits of the output range and indicates the respectively valid scaling factor. Switching operations into the other direction take place at zero crossings of the output signal of the integrator. The analog/digital converter is particularly suitable for processing the output signal of a current or voltage converter.

7 Claims, 6 Drawing Figures

ANALOG/DIGITAL CONVERTER

BACKGROUND OF THE INVENTION

1. Field of the Invention

This invention relates to an analog/digital converter.

2. Discussion of Background

A prior art analog/digital converter is known, for example, from U.S. Pat. No. 4,296,412.

A/D converters are needed, particularly for electronic current transformers, which, apart from a brief "data refresh" so that the phase errors are kept small, also require a very wide dynamic range. In a combined converter for measuring and protection purposes (for example IEC class 0.2 in conjunction with IEC class 5P30), a dynamic range of up to 20 bits can be required.

The rapid "data refresh" can be achieved by tracking according to the above-noted U.S. Pat. No. 4,296,412 or also according to a circuit described and illustrated in Swiss Patent Application No. 10628/84 of Mar. 30, 1980 by the applicant.

The dynamic range of the analog/digital converter according to U.S. Pat. No. 4,296,412 is restricted by the number of digits at the output of the digital integrator or at the input of the digital/analog converter used for feedback, on the one hand, and by the demands on the accuracy of conversion of the input signal, on the other hand, even if the such demands apply only to a part of the range swept by the input signal.

It has also been proposed to expand the dynamic range of a tracking-type A/D converter arbitrarily by using several tracking loops. However, this method has the disadvantage that some analog components such as, for example, D/A converters and voltage comparators (or complete sets of window discriminators, since preferably tracking loops having an increased tracking rate are used) are repeated several times in the whole A/D converter.

SUMMARY OF THE INVENTION

Accordingly, one object of this invention is to provide a novel analog/digital converter which achieves a simplification of the tracking-type A/D converter with an arbitrarily expandable dynamic range, which has a favorable effect on costs and also achieves better MTBF (mean time between failure) values by using a smaller number of analog components, that is to say is operationally more reliable.

In this context, the invention is based on the following idea: a normal tracking-type A/D converter consists of a scaling amplifier for the input signal, a D/A converter, a digital integrator, a multiple window discriminator (for example according to the Swiss Patent Application 10628/84 mentioned), a clock generator and of means for comparing the instantaneous value of the scaled signal with the output signal of the D/A converter.

For expanding the dynamic range via the number of bits of the D/A converter, it is then proposed, according to the invention, to supplement the generic tracking-type A/D converter by a scaling amplifier with switchable gain, a digital multiplier of the value stored in the integrator, means for storing the multiplied output value of the integrator back into the integrator, and a digital range-switch/memory ("range selector") which is preferably controlled by the output of the integrator.

The advantages achieved by the invention are especially found in the fact that it makes possible an almost arbitrary amplification of the dynamic range as compared with the known generic analog/digital converters without having to accept in exchange a reduced conversion accuracy in comparision with a comparable known generic analog/digital converter as long as the input signal varies within a range in which it would be accessible to being processed by such a converter. An important advantage also lies in the extraordinarily rapid "data refresh" which only occupies one clock period under normal operating conditions.

The conversion of the input signal adapts itself to the magnitude of the latter in such a manner that the quantization error has a fixed relationship to the order of magnitude reached in each case by the input signal. This characteristic of the analog/digital converter according to the invention makes it highly suitable for processing the output signal of a current or voltage transformer, especially if the transformer is simultaneously used for measuring and protection purposes since not only can the undisturbed signal, which remains within a limited range, be converted with high accuracy which is adequate for measuring purposes but also high-amplitude disturbances such as occur, for example, with short circuits, can be detected with adequate accuracy for protection purposes.

The circuits of analog/digital converters according to the invention can be implemented very simply and inexpensively. In the text which follows, the invention is explained in greater detail with the aid of drawings, representing only one illustrative embodiment, and of some diagrams.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

In the drawing.

DESCRIPTION OF THE PREFERRED EMBODIMENTS

Figure 1:
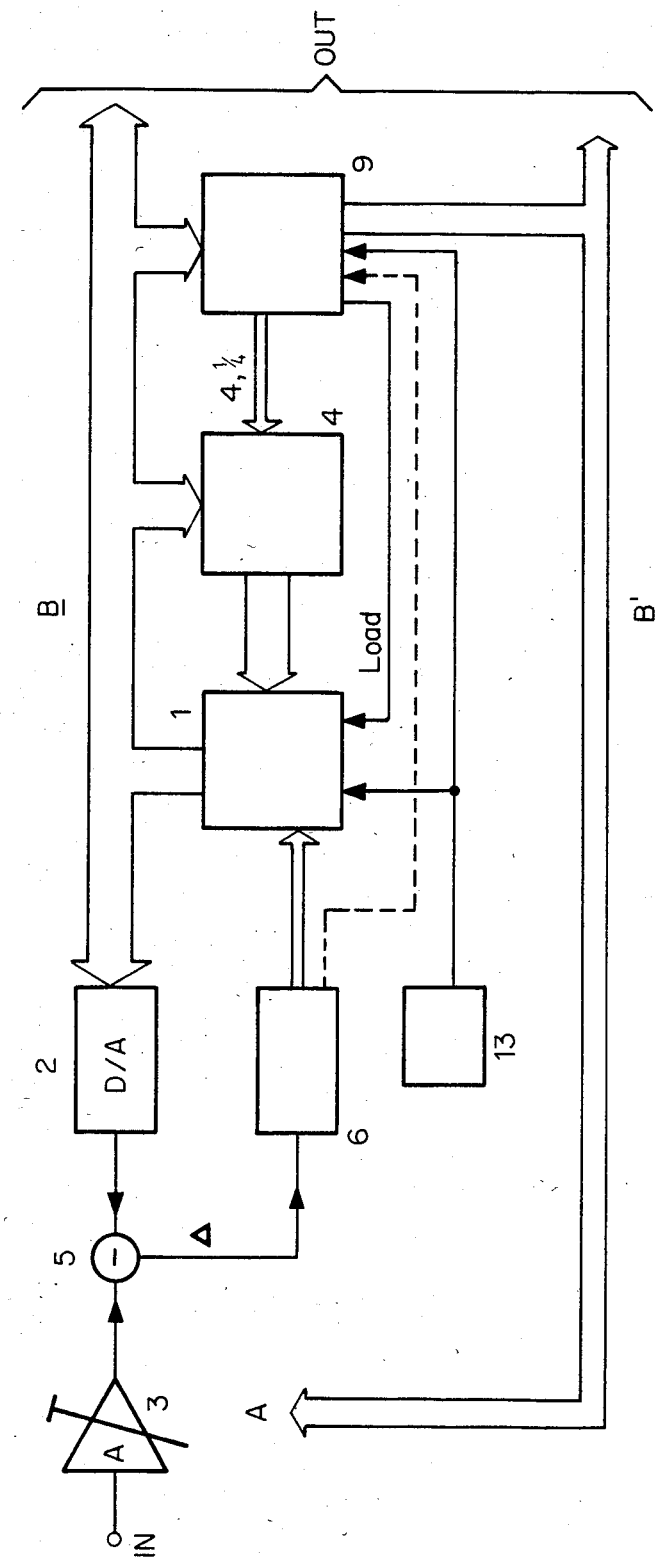
FIG. 1 is a the block diagram of a tracking-type analog/digital converter having an expanded dynamic range, which will be used for explaining the invention.

Referring now to the drawings, wherein like reference numerals designate identical or corresponding parts throughout the several views, in the block diagram according to FIG. 1, reference numeral 1 designates a digital integrator having a 12-bit output which is connected to a 12-bit-wide bus B. The bus B is also connected to a 12-bit digital/analog converter (D/A converter) 2. The input signal E of the analog/digital converter is connected to the input IN of a scaling amplifier 3 for scaling the input signal with a gain factor A of which is adjustable. In this example, a scaling amplifier 3 having a switchable gain A=1, ¼, 1/16, 1/64 is assumed (see FIG. 3). The outputs of the scaling amplifier 3 and of the D/A converter are fed to a subtractor 5 which forms a difference signal $\Delta$ from these output signals. The different signal is fed via a tracking circuit 6 ("increment quantizer") to the digital integrator 1. The bus B is also connected to a digital multiplier 4 which is designed for multiplying, under control of the control logic 9 serving as range switch, the output data of the digital integrator 1 optionally by the factors of 4 or of ¼. The set of output data coming from the output OUT consists of the 12-bit output of the integrator 1 (11 bits and sign) and a digital output of the control logic 9 which serves as multiplication factor (for example in coded form as indication of the binary power) for the 12 bits. The latter factor is fed via the bus B' to the scaling amplifier and there effects the switching of the gain factor A. The timing of the control logic 9 and of the digital integrator 1 is controlled by a central clock generator 13.

If the input signal is small, initially the gain factor 1 is switched on and the tracking loop operates in the familiar manner. If the instantaneous state of the integrator 1 exceeds a preselected absolute value (for example between 7/8 and 8/8 of a "full scale") due to the increase of the scaled input signal, the control logic 9 automatically switches the gain of the scaling amplifier arrangement 3 to ¼. Simultaneously, the output data, multiplied by the factor of ¼, of the integrator 1 are loaded as the result of a load command back into the integrator 1 so that the analog output value of the D/A converter 2 is also divided by the same factor of 4. After the switching transients of the scaling amplifier 3 and of the D/A converter 2 have decayed ("settling time"), equilibrium is restored at the input of the "tracking circuit 6" within one clock period. Since simultaneously with the reloading of the integrator 1 the new range information is applied to the output of the control logic 9, the value of the digital output data set (range multiplication factor times output data of the integrator) is constant even during range switching.

The automatic switching to the higher ranges (1/16 and 1/64) takes place analogously.

If the signal amplitude drops again, the range switch switches to the next lower, more sensitive range at a pre-selected value of the scaled input signal. The output value, multiplied by a factor of 4, of the integrator is then loaded by the load command into the integrator so that equilibrium of the analog values is again achieved. Simultaneously, the digital multiplication factor also changes in the output data set so that the digital value remains constant again.

Since all range switching operations take place within one clock period, the "data refresh" remains unchanged.

Switching to a more sensitive (lower) signal range can preferably occur when the zero value is reached where a multiplication by the factor of 4 can be omitted. This also makes it possible to simplify the logic circuit considerably.

Figure 2:
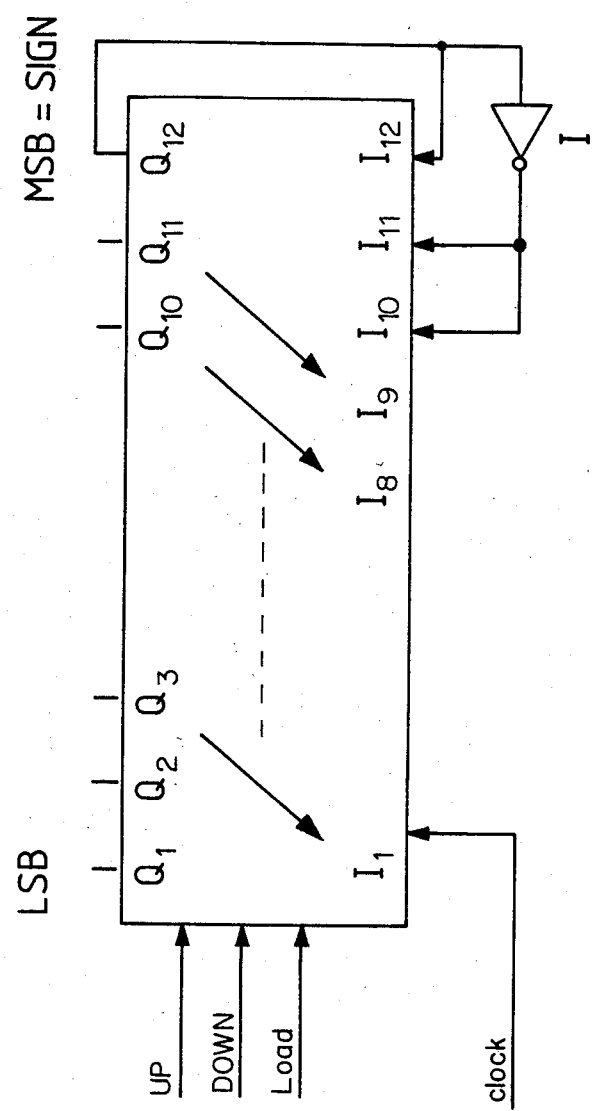
FIG. 2 is a diagrammatic representation of a digital integrator comprising a ¼-times multiplier.

FIG. 2 shows diagrammatically an illustrative embodiment of a 12-bit integrator comprising a times ¼ multiplier. The integrator is built up as a three-stage cascade of up/down counters, for example 74LS169. The outputs $Q_3$ to $Q_{11}$ are connected, offset downwards by 2 bits each, to the parallel data inputs $I_1$ to $I_9$. The most significant (MSB) bit remains unchanged and is still fed via an inverter I to the data inputs $I_{10}$ and $I_{11}$. For the multiplication by the factor ¼, a clock-synchronous "load" command is used to load the shifted data (divided-by-4 state of the integrator) back into the counter.

Whilst the above explanations have the aim of illustratively clarifying the basic action of the invention, a more detailed illustrative embodiment is used in the following text to explain the configuration and operation of a preferred embodiment of the analog/digital converter according to the invention.

Figure 3:
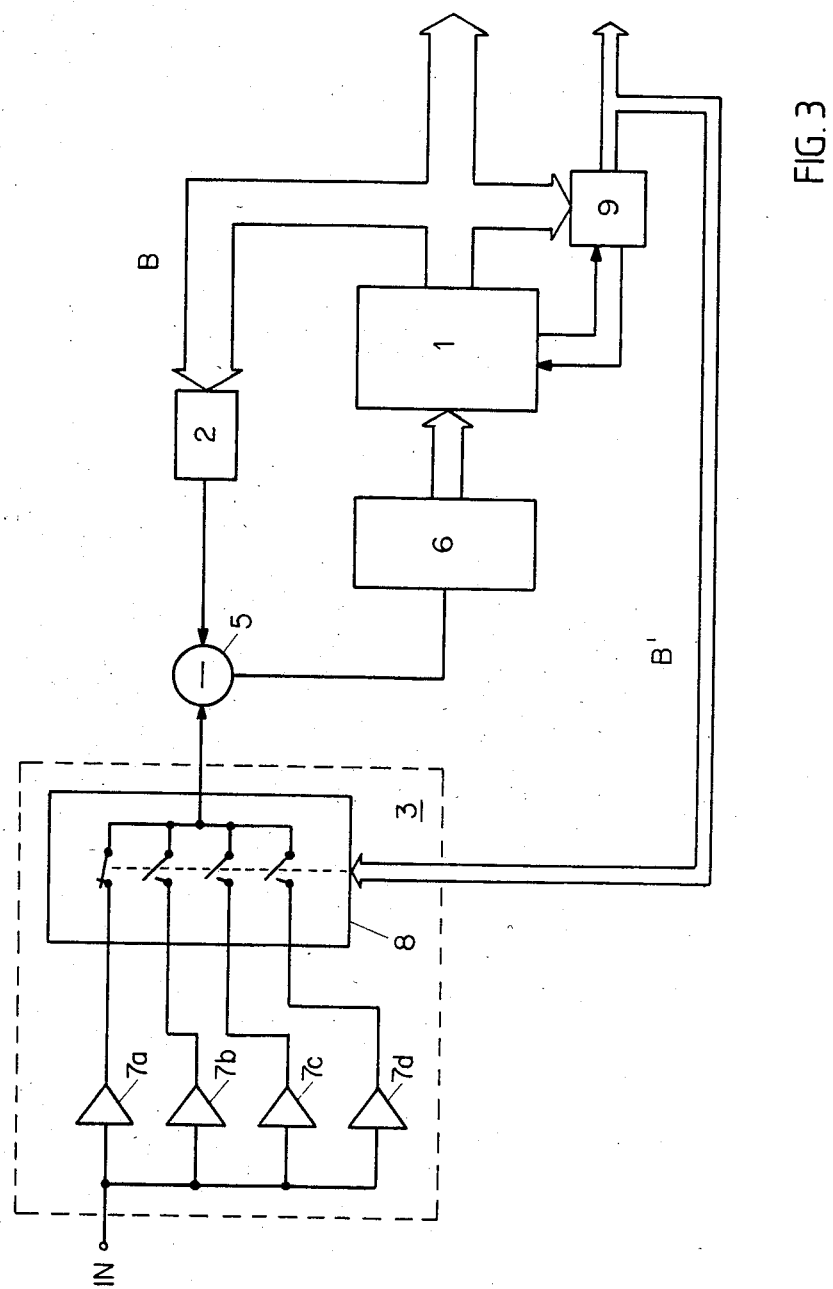
FIG. 3 is a block diagram, which is detailed compared with FIG. 1, of an illustrative embodiment of the invention.
Figure 4:
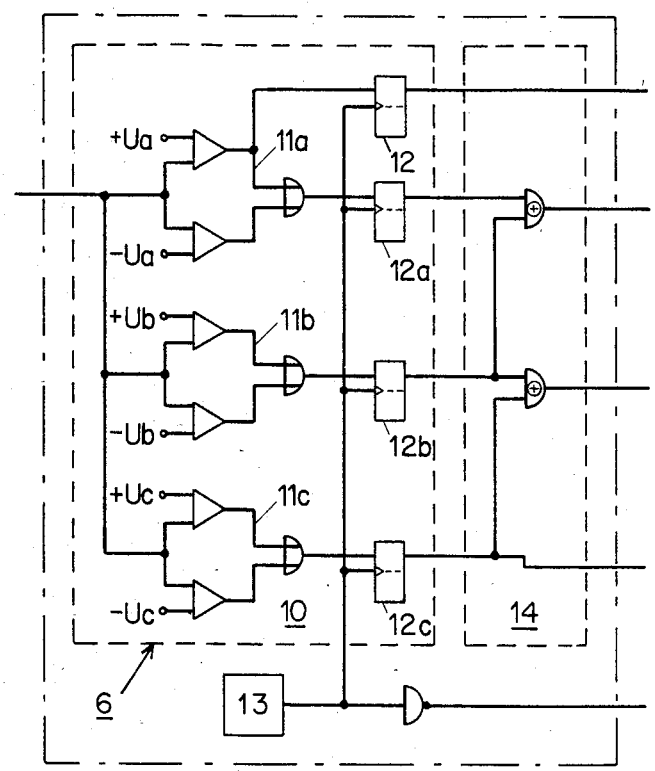
FIG. 4 is a circuit diagram of an illustrative embodiment of a multiple window discriminator as used in the circuit according to FIG. 3.
Figure 5:
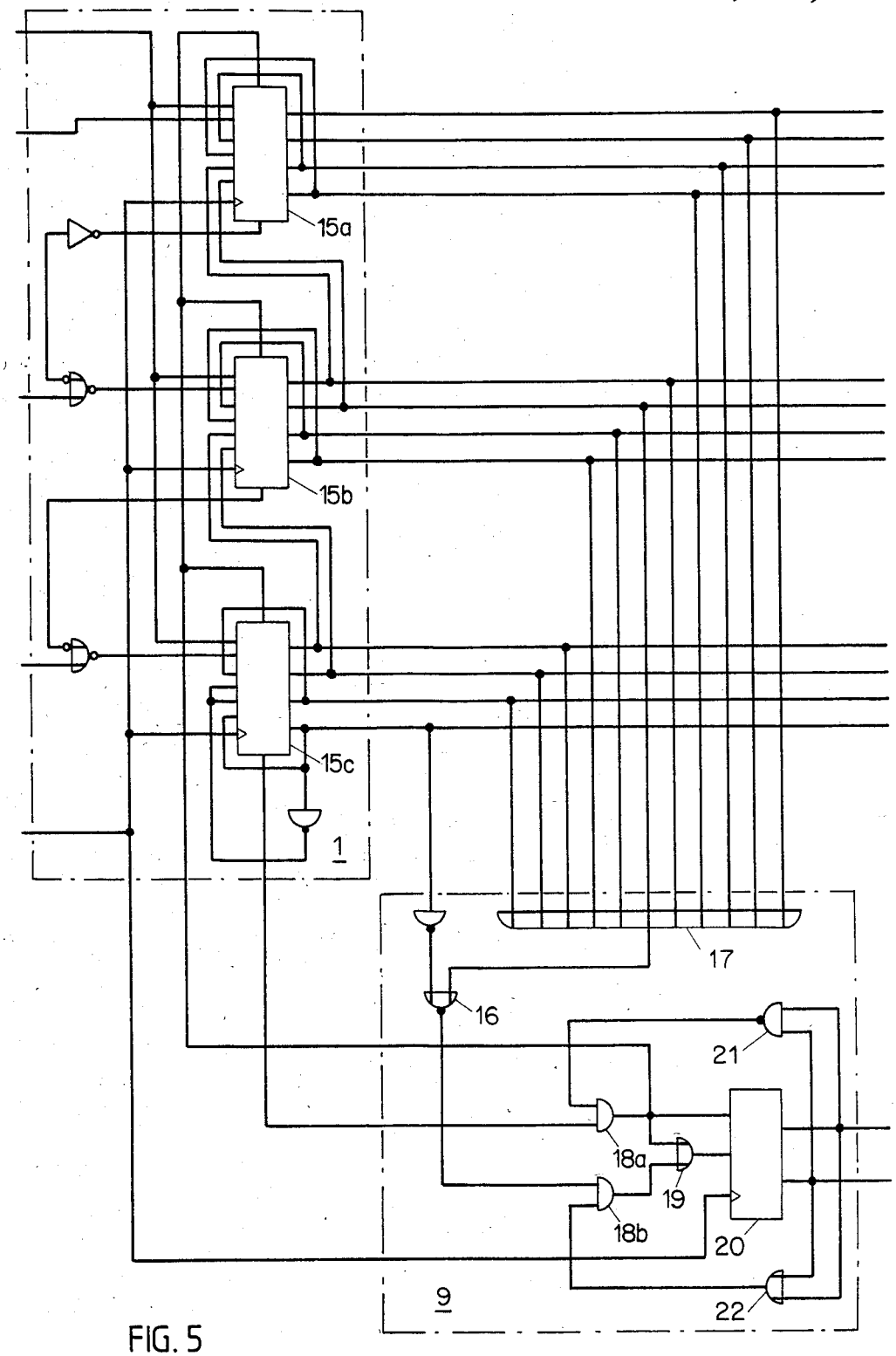
FIG. 5 is a circuit diagram of an illustrative embodiment of the digital integrator comprising cascaded up-/down counters and the associated control logic for the A/D converter.

The analog/digital converter shown in FIGS. 3 to 5 has a digital integrator 1 having a 12-bit output, a digital/analog converter 2 which follows the former, an input amplifier 3 for scaling the input signal E, the input of which is connected to the input terminal IN of the analog/digital converter, a subtracter 5 which forms a difference signal from the output signal of the input amplifier 3 and that of the digital/analog converter 2, and a tracking circuit 6 which is supplied with the difference signal and which uses this signal to generate tracking signals which are fed to the integrator 1.

The input amplifier 3 comprises four amplifiers 7a, 7b, 7c and 7d having fixed gain factors A=1, ¼, 1/16 and 1/64, respectively. The amplifiers are followed by a selection switch 8 which in each case applies the output of one of amplifiers 7a–7d to the output of the input amplifier 3. The selection switch 8 is controlled by a control logic 9 which, if necessary, switches the selection switch 8 to the next amplifier if the upper or lower limit of the working range of the integrator 1 is exceeded and simultaneously changes the value of the digital output signal of the integrator 1 which corresponds to dividing this signal by 4, neglecting the remainder. The control logic 9 also indicates the respectively valid gain factor.

The tracking circuit 6 (FIG. 4) contains a multiple window discriminator 10 comprising a first discriminator 11a which determines whether the amount of the difference signal exceeds a first limit value $U_a$ and, if so, the polarity of this signal, and a second discriminator 7b and a third discriminator 7c which check the difference signal to determine whether its amount exceeds a second limit value $U_b$ and a third limit value $U_c$, respectively. The first limit value $U_a$ is a little greater than one half of the voltage corresponding to a least significant bit, that is to say the voltage appearing at the output of the digital/analog converter 2 when its input is supplied with only one least significant bit, the second limit value $U_b$ is about 10-times as large as the set voltage, that is to say a little larger than one half of the voltage corresponding to a bit having the significance of $2^4$ and the third limit value $U_c$ is about 150-times as large as the voltage corresponding to a least significant bit, that is to say a little larger than one half of the voltage corresponding to a bit having the significance of $2^8$. The discriminators 11a, b, c are followed by D-type flipflops 12, 12a, b, c which store the respective output signals of the discriminators 11a, b, c on the positive edges of a clock signal supplied by a clock generator 13. Flipflop 12 stores the polarity signal, while flipflops 12a, b, c store the amount signals.

The multiple window discriminator 10 is followed by a logic circuit 14 which, if several positive amount signals occur, passes in each case only the positive amount signal corresponding to the highest amount.

The integrator 1, a practical implementation of which is shown in FIG. 5 is configured as a three-stage cascade of settable 4-bit up/down counters (for example SN 54 LS 669) 15a, b, c. At each of the counting direction inputs of the counters 15a, b, c the polarity signal supplied by the tracking circuit 6 is present, the counting input of the first counter 15a is supplied with the amount signal corresponding to the lowest amount, that of the second counter 15b is supplied with that corresonding to the medium amount and that of a third counter 15c is supplied with that corresponding to the highest amount. Thus, positive amount signals effect additions of bits having a significance of $2^0$, $2^4$ and $2^8$, respectively, to the output signal of the integrator 1 or subtractions from this signal, depending on the value of the polarity signal, corresponding to the amounts $U_a$, $U_b$, $U_c$ of the limit values with which the difference signal is compared in the discriminators 11a, b, c. The counters 15a, b, c are controlled by the positive edges of the inverted clock signal.

The outputs of the integrator 1, at which the bits having significance of $2^2$ to $2^{10}$ appear, are each connected to the set input for the bit having a position significance which is lower by 2, the output at which the bit having a significance of $2^2$ appears, is connected to the set input for the least significant bit and so forth. The bit having a significance of $2^{11}$, which also indicates the polarity—an analog zero corresponds to an output signal of the integrator 1 in which the bit having a significance of $2^{11}$ is "1" and all others are "0"—is directly fed to the set input allocated to itself and is fed inverted to the set inputs for the bits having the significances of $2^9$ and $2^{10}$. Each of the counters 15a, b, c is provided with an input for set commands.

The control logic 9 is provided with a NOR gate 16 which is supplied, on the one hand, with the inverted bit having a significance of $2^{11}$ and, on the other hand, with the output signal of an OR gate 17 which logically combines the bits having the significance of $2^0$ to $2^{10}$. Whilst the first AND gate 18a is supplied with the overflow signal of the third counter 15c of the integrator 1, the output signal of the NOR gate 16 is fed to a second AND gate 18b. The outputs of the AND gates 18a and 18b are fed, logically combined by an OR gate 19, to the counting input of an up/down counter 20 at the counting direction input of which in each case the output signal of the first AND gate 18a is present and which is controlled by the same clock signal as the counters 15a, b, c of the integrator 1. The two digital signals present at the output of the counter are fed, on the one hand, logically combined by a NAND gate 21, to the first AND gate 18a and, on the other hand, logically combined by an OR gate 22, to the second AND gate 18b. In addition, they form the digital output signal of the control logic 9 which controls the input amplifier 3 and indicates the respective scaling factor of the latter.

The output of the first AND gate 18a is connected to the inputs for set commands of the counters 15a, b, c of the integrator 1.

Figure 6:
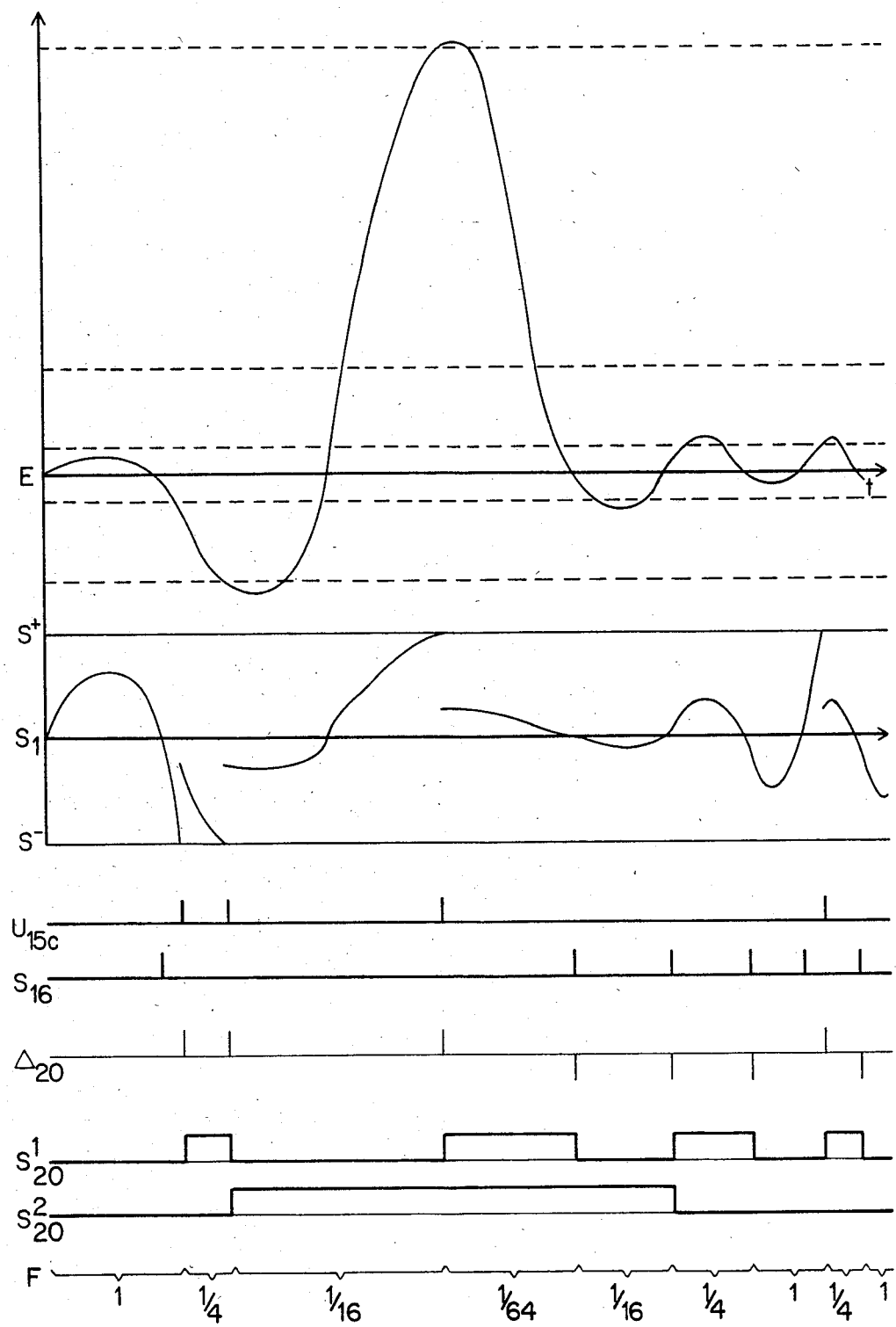
FIG. 6 is a timing diagram illustrating the variation with time of the input signal and the variations with time of some signals occurring in the analog/digital converter according to FIG. 3 during the conversion of the input signal.

In the text which follows, the operation of the analog/digital converter according to FIGS. 3 to 5 is explained in greater detail with the aid of FIG. 6.

At the top of FIG. 6, an illustrative variation over time of an input signal E, beginning at zero, is shown and below that the output signal $S_1$ of the digital integrator 1 in analog representation.

As an initial state is assumed that the two range-determining outputs $S_{20}^1$ and $S_{20}^2$ of the control logic are "0" and the output signal of the circuit for scaling the input signal 3—now identical to the output signal of the amplifier 7a—is much smaller than the full-scale value of the D/A converter 2.

The changes in the analog input signal are tracked by the digital integrator 1 which executes the up- or down-counting commands generated by the tracking circuit 6 on one of the three up/down counters 15a, b, c. If with a "1111" state an up-counting command or with a "0000" state a down-counting command is present at the third four-bit up/down counter 15c, this counter generates an overflow signal which prevents the tracking step and, instead, initializes a rapid range switching operation.

The overflow signal $U_{15c}$ reaches the first AND gate 18a and, since the output signal of the NAND gate 21 is "1", is fed, on the one hand, to the counting direction input of the counter 20 and, on the other hand, via the OR gate 19 to the counting input of the latter and thus causes it to count up, shown in diagram $\Delta_{20}$, the first output signal $S_{20}^1$ of the counter 20 from "0" to "1" which, firstly, effects a switching of the selection switch 8 which now applies the output signal of the second amplifier 7b to the output of the input amplifier 3 and, on the other hand, indicates that the valid gain factor differs from the gain factor of the first amplifier 7a by a factor of proportionality $F=\frac{1}{4}$. The subtractor 5 is thus supplied from then on and until further notice with a signal which is smaller by a factor of $F=\frac{1}{4}$. Simultaneously, the overflow signal $U_{15c}$ passed through the first AND gate 18a is fed as a set command to the appropriate inputs of the counters 15a, b, c. This causes the bits having the significances $2^9$ and $2^{10}$ to change their state and the bits having the significances of $2^0$ to $2^8$ in each case to assume the previous state of the bit having a significance which is higher by a factor of 4, which corresponds to a division by 4 of the output value of the integrator 1.

Since the tracking steps produced by the tracking circuit 6 are now generated on the basis of a signal scaled by a factor which is smaller by $\frac{1}{4}$, the tracking steps are amplified by a factor of 4 as compared with the input signal E. The relationship between the order of magnitude of the input signal E and the tracking rate of the output signal of the analog/digital converter thus remains approximately constant.

If the third up/down counter 15c again reaches one of its full-scale values ("1111" or "0000") in spite of the reduction of the scaling factor by a factor of 4, it again generates, with the appropriate counting command, an overflow signal $U_{15c}$ which initializes the next range switching operation.

The state of the counter 20 is incremented by 1, the output of the circuit for scaling the input signal 3 is supplied with the output signal of the amplifier 7c and the output value of the integrator 1 is again divided by 4. The proportionality factor F is now 1/16.

Another further switching operation can be carried out in the same manner. If the smallest gain factor is effective—the proportionality factor F compared with the largest gain factor is then 1/64—both output signals $S_{20}^1$, $S_{20}^2$ of the counter 20 are then "1", the NAND gate 21 produces a "0" signal and the first AND gate 18a therefore inhibits any other overflow signals $U_{15c}$ of the third counter 15c.

When the output signal $S_1$ of the integrator 1 passes through zero—the bit having the significance of $2^{11}$ then has the value "1" and the other bits the value of "0"—the output signal $S_{16}$ of the NOR gate 16 is a "1" signal which passes via the second AND gate 18b and the OR gate 19 to the counting input of the counter 20 if the largest gain factor is not already effective and accordingly the two output signals $S_{20}^1$, $S_{20}^2$ of the integrator 1 are "0" and thus also the output signal of the OR gate 22. Since the signal simultaneously present at the counting direction input is "0", the counter 20 performs a downcounting step which effects a switching of the input amplifier 3 to the respectively next-higher gain factor. Since the switching takes place at the zero crossing, a corresponding resetting of the output signal $S_1$ of the integrator 1 is not necessary.

The switching can also be omitted—as shown at the second zero crossing of the output signal $S_1$ of the integrator 1—if a higher-significance counting signal reaching the integrator 1 skips over the output signal corresponding to zero of the integrator 1. However, this is an undesirable effect since a decrease in the order of magnitude of the extremes of the input signal E cannot yet be expected when such counting signals occur. Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An analog/digital converter comprising:
   a digital integrator;
   a digital/analog converter which is supplied with an output of the digital integrator;
   an input amplifier which is supplied by an analog input signal;
   a subtractor which forms a difference signal from an output of the input amplifier and an output of the digital/analog converter;
   a tracking circuit which generates tracking signals for the digital integrator as a function of the difference signal;
   said input amplifier having a variable gain factor controlled as a function of the output of the digital integrator;
   a multiplier connected to the digital integrator for multiplying the output of the digital integrator and for loading the multiplied output back into the digital integrator; and
   a control logic controlled by the output of the digital integrator provided for range switching and storing a first output bit pattern which represents the gain factor of the input amplifier, the output of the digital integrator forming a second output bit pattern, said first and second output bit patterns together forming a digitized measured value corresponding to said analog input signal.

2. An analog/digital converter according to claim 1, wherein:
   the input amplifier comprises means for switching between a first and at least one further gain factor, the further gain factor being smaller than the first gain factor; and
   said control logic constructed such that, when the output of the digital integrator exceeds a positive threshold value (S+) or drops below a negative limit value (S−), a switching to a smaller gain factor is effected and simultaneously the output of the digital integrator is multiplied by a factor which corresponds to the quotient of the current gain factor to which the logic is just switching and the immediately previous gain factor, said control logic effecting a further switching of the input value back to a larger gain factor if the switching to a smaller gain factor leads to an output value of the digital integrator which lies between said threshold values (S+, S−).

3. An analog/digital converter according to claim 2, wherein the control logic comprises:
   means for effecting a switching to a larger gain factor when the output of the digital integrator indicates the value zero.

4. An analog/digital converter according to claim 3, wherein said gain factors differ in each case by an integral power of two.

5. An analog/digital converter according to claim 4, wherein the digital integrator comprises a settable up-/down counter and, for the purpose of resettings of an output of said up/down counter during switching operations from one gain factor to another which differs from the former by a factor of $2^{-n}$, each bit, apart from the most significant bit, if necessary, is fed from the output of the digital integrator to a set input of said up/down counter for setting another bit the significance of which differs in each case from that of the first bit by a factor of $2^{-n}$.

6. An analog/digital converter according to claim 5, wherein the tracking circuit comprises a multiple window discriminator comprising:
   a first discriminator which compares the difference signal with a positive first upper limit value and a negative first lower value the absolute values of which lie between zero and the amplitude, corresponding to a least-significant bit at the output of the digital integrator, of the analog signal at the output of the digital/analog converter, and if the first upper limit value is exceeded and the signal drops below the first lower limit value in each case generates a corresponding tracking signal for incrementing or decrementing the number present at the output of the digital integrator by a first increment which has the value of the least significant bit;
   at least a second discriminator which compares the difference signal with a further upper limit value and with a further lower limit value, and if the further upper limit value is exceeded and if the signal drops below the further lower limit value, generates in each case a corresponding tracking signal for incrementing or decrementing the number present at the output of the digital integrator by a further increment, wherein the further increment is in each case larger than the preceding one, the absolute values if the limit values of the further discriminator in each case lie between the analog signal amplitude corresponding to the preceding increment and the analog signal amplitude corresponding to the further increment; and
   a logic circuit connected to the outputs of said first and second discriminators, said logic circuit in each case passing only the tracking signal corresponding to the highest tracking number of the tracking signals generated by the first and second difference discriminators.

7. An analog/digital converter according to claim 6, wherein one increment differs from the preceding one in each case by a factor which is an integral power of two.

* * * * *